(12) United States Patent
Chen

(10) Patent No.: US 10,054,831 B2
(45) Date of Patent: Aug. 21, 2018

(54) ARRAY SUBSTRATE AND FABRICATION METHOD THEREOF, AND DISPLAY PANEL

(71) Applicants: Xiamen Tianma Micro-electronics Co., Ltd., Xiamen (CN); Tianma Micro-electronics Co., Ltd., Shenzhen (CN)

(72) Inventor: Binbin Chen, Xiamen (CN)

(73) Assignees: Xiamen Tianma Micro-electronics Co., Ltd., Xiamen (CN); Tianma Micro-electronics Co., Ltd., Shenzhen (CN)

( * ) Notice: Subject to any disclaimer, the term of this patent is extended or adjusted under 35 U.S.C. 154(b) by 199 days.

(21) Appl. No.: 15/139,655

(22) Filed: Apr. 27, 2016

(65) Prior Publication Data
US 2017/0219892 A1 Aug. 3, 2017

(30) Foreign Application Priority Data
Jan. 29, 2016 (CN) .......................... 2016 1 0064991

(51) Int. Cl.
*G02F 1/1345* (2006.01)
*G02F 1/1333* (2006.01)
(Continued)

(52) U.S. Cl.
CPC ...... *G02F 1/136204* (2013.01); *G02F 1/1368* (2013.01); *G02F 1/133512* (2013.01); *G02F 1/133514* (2013.01); *H01L 27/0292* (2013.01); *H01L 27/1244* (2013.01); *H01L 27/1259* (2013.01); *H01L 29/78633* (2013.01); *G02F 1/13338* (2013.01); *G02F 1/13458* (2013.01);
(Continued)

(58) Field of Classification Search
CPC ................................................. G02F 1/136209
See application file for complete search history.

(56) References Cited

U.S. PATENT DOCUMENTS

| | | | | |
|---|---|---|---|---|
| 2003/0117536 A1* | 6/2003 | Jeon | ................. | G02F 1/136286 349/40 |
| 2015/0062473 A1* | 3/2015 | Nishino | ............ | G02F 1/136204 349/40 |

FOREIGN PATENT DOCUMENTS

| | | |
|---|---|---|
| CN | 1249649 C | 4/2006 |
| CN | 101398544 A | 4/2009 |

(Continued)

*Primary Examiner* — Wen-Ying P Chen
(74) *Attorney, Agent, or Firm* — Anova Law Group, PLLC

(57) ABSTRACT

An array substrate and an array substrate fabrication method are provided. The array substrate comprises a base substrate, a first conductive layer, a first passivation layer including a plurality of first through-holes. a light-shielding layer including a plurality of first metal wires arranged in parallel, a second passivation layer including a plurality of second through-holes, and a first metal layer including a plurality of second metal wires arranged in parallel and one-to-one corresponding to the plurality of first metal wires. The first metal wire is electrically connected to the first conductive layer through at least one first through-hole, and the second metal wire is electrically connected to the corresponding first metal wire through at least one second through-hole. The array substrate includes a display region and a non-display region, and the first through-holes and the second through-holes are formed at the non-display region of the array substrate.

18 Claims, 6 Drawing Sheets

(51) Int. Cl.
*G02F 1/1362* (2006.01)
*G02F 1/1335* (2006.01)
*G02F 1/1368* (2006.01)
*H01L 27/02* (2006.01)
*H01L 27/12* (2006.01)
*H01L 29/786* (2006.01)

(52) U.S. Cl.
CPC .. *G02F 1/136209* (2013.01); *G02F 1/136227* (2013.01); *G02F 1/136286* (2013.01); *G02F 2001/13629* (2013.01); *G02F 2001/136218* (2013.01)

(56) References Cited

FOREIGN PATENT DOCUMENTS

| | | |
|---|---|---|
| CN | 103021943 A | 4/2013 |
| CN | 104937655 A | 9/2015 |
| TW | M265639 U | 5/2005 |

\* cited by examiner

ARRAY SUBSTRATE AND FABRICATION METHOD THEREOF, AND DISPLAY PANEL

CROSS-REFERENCES TO RELATED APPLICATIONS

This application claims priority of Chinese Patent Application No. 201610064991.9, filed on Jan. 29, 2016, the entire contents of which are hereby incorporated by reference.

FIELD OF THE INVENTION

The present disclosure relates to the field of display technology and, more particularly, relates to an array substrate and related fabrication techniques, and a display panel including the array substrate.

BACKGROUND

Electrostatic breakdown (ESD) often happens in a display panel manufacturing process due to a buildup of static electricity, in which a sudden flow of electricity is generated when charges are transferring through tiny wires or points where the wires cross. ESD may cause severe damage to electronic devices.

With demand for higher PPI (Pixel per Inch), the size of pixels in the display panel, the line width of metal wires, as well as the gap between adjacent metal wires become smaller and smaller, and the adjacent metal wires may be even in contact each other.

In existing technologies, antistatic devices are formed by one or more thin film transistors (TFTs) or leads disposed in a display panel. To release the static electricity from the display panel, different leads in the antistatic devices are used as inputs and outputs of the static electricity, such that the static electricity may be exported or gradually decayed along the leads. However, before forming the antistatic devices, damage to wires caused by the accumulation of the static electricity is often inevitable.

The disclosed array substrate and related fabrication techniques, and display panel including the array substrate are directed to solve one or more problems set forth above and other problems.

BRIEF SUMMARY OF THE DISCLOSURE

One aspect of the present disclosure provides an array substrate. The array substrate comprises a base substrate, a first conductive layer formed on the base substrate, a first passivation layer formed on the first conductive layer and including a plurality of first through-holes, a light-shielding layer formed on the first passivation layer and including a plurality of first metal wires arranged in parallel, a second passivation layer formed on the light-shielding layer including a plurality of second through-holes, and a first metal layer formed on the second passivation layer and including a plurality of second metal wires arranged in parallel and one-to-one corresponding to the plurality of first metal wires. The first metal wire is electrically connected to the first conductive layer through at least one first through-hole, and the second metal wire is electrically connected to the corresponding first metal wire through at least one second through-hole. The array substrate includes a display region and a non-display region, and the first through-holes and the second through-holes are formed at the non-display region of the array substrate.

Another aspect of the present disclosure provides a display panel comprising the array substrate thereof, a color film substrate arranged opposite to the array substrate, and a liquid crystal layer sandwiched between the color film substrate and the array substrate.

Another aspect of the present disclosure provides an array substrate fabrication method. The method comprises forming a first conductive layer on a base substrate, forming a first passivation layer on the first conductive layer and a plurality of first through-holes perpetrating the first passivation layer, forming a light-shielding layer on the first passivation layer, forming a second passivation layer on the light-shielding layer and a plurality of second through-holes penetrating the second passivation layer, and forming a first metal layer on the second passivation layer. The light-shielding layer includes a plurality of first metal wires arranged in parallel, and the first metal wire is electrically connected to the first conductive layer through at least one first through-hole. The first metal layer includes a plurality of second metal wires arranged in parallel and one-to-one corresponding to the plurality of first metal wires, and the second metal wire is electrically connected to the corresponding first metal wire through at least one second through-hole.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. It is apparent that the described embodiments are some but not all of the embodiments of the present invention. Based on the disclosed embodiments, persons of ordinary skill in the art may derive other embodiments consistent with the present disclosure, all of which are within the scope of the present disclosure.

Figure 1:
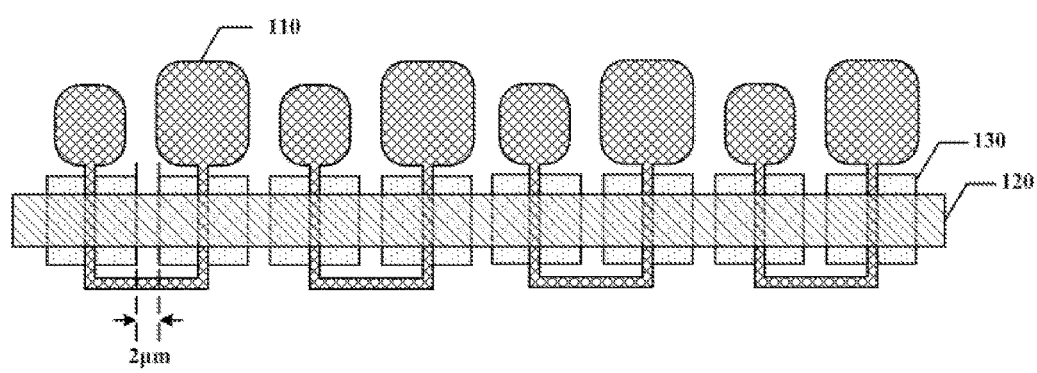
FIG. 1 illustrates a schematic diagram of a display panel.

FIG. 1 illustrates a schematic diagram of a display panel. As shown in FIG. 1, the display panel includes a plurality of pixel electrodes and a plurality of thin film transistors (TFTs). Each pixel electrode is connected to a corresponding TFT, which includes a source (drain) electrode 110 and a gate electrode 120. A channel is formed between the source electrode and the drain electrode. The display panel also includes a light-shielding layer including a plurality of light-shielding metal blocks 130, which are disposed on the gate electrodes 120 of the plurality of TFTs.

FIG. 1 also illustrates the locations of the source (drain) electrodes 110 and gate electrodes 120 of the TFTs as well as the light-shielding metal blocks 130 in the display panel. The gap between two adjacent light-shielding metal blocks is about 2 μm, which may be further decreased as the PPI increases. Due to the limited accuracy of the etching process, when the gap between two adjacent light-shielding metal blocks is too small, it may be difficult to guarantee that the two adjacent light-shielding metal blocks are electrically isolated while the light-shielding metal blocks 130 fully cover the channels of the TFTs at the same time.

Figure 2:
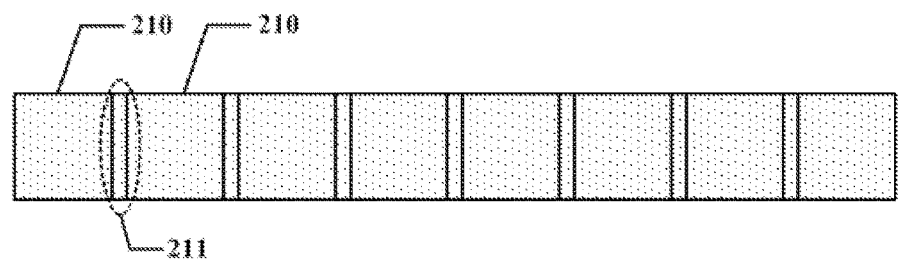
FIG. 2 illustrates locations of adjacent light-shielding metal blocks in a display panel with increasing PPI (Pixel per Inch)

FIG. 2 illustrates locations of adjacent light-shielding metal blocks in a display panel within increasing PPI (Pixel per Inch). As shown in FIG. 2, a gap 211 between two adjacent light-shielding metal blocks 210 is substantially small. Thus, in practical manufacturing of the display panel, the gaps 211 between adjacent light-shielding metal blocks 210 are no longer etched in a light-shielding layer. Instead, a plurality of light-shielding metal wires may be fabricated, each of which may cover the channels of the TFTs in a row of pixels.

Further, when subsequent metal layers (e.g., a metal layer including data lines, etc.) are disposed on the plurality of light-shielding metal wires, the probability of occurrence of "antenna effect" is also growing. The "antenna effect" is an effect in which charges are accumulated in isolated nodes of an integrated circuit during its processing. The "antenna effect" may potentially cause yield and reliability problems during the manufacture of metal oxide semiconductor (MOS) integrated circuits.

Figure 3A:
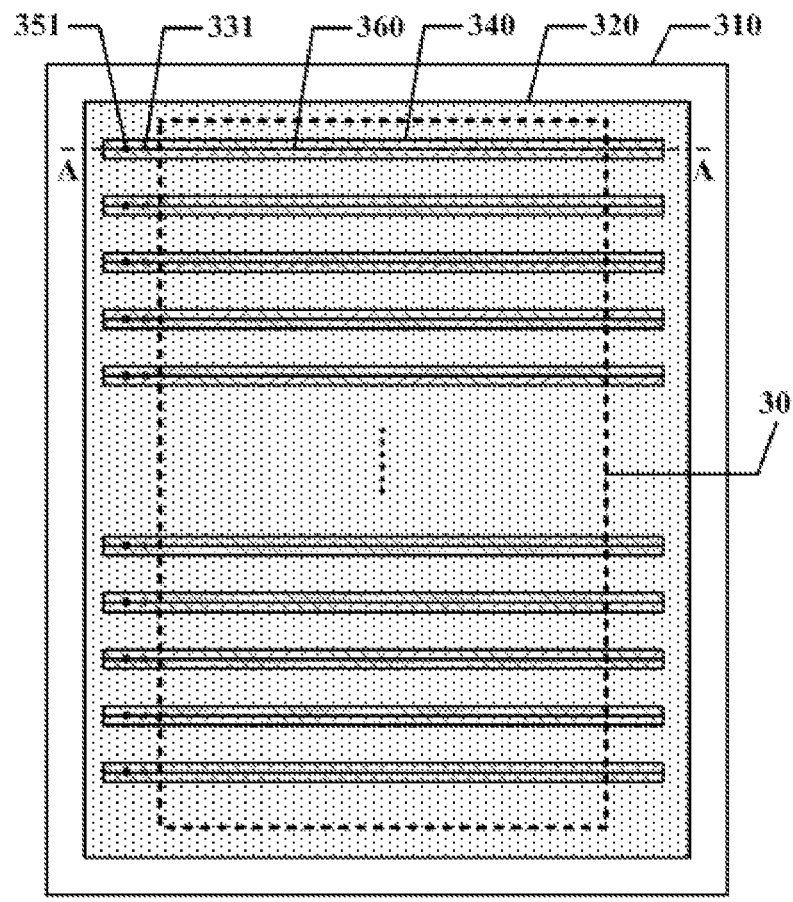
FIG. 3a illustrates a top view of an exemplary array substrate consistent with disclosed embodiments.
Figure 3B:
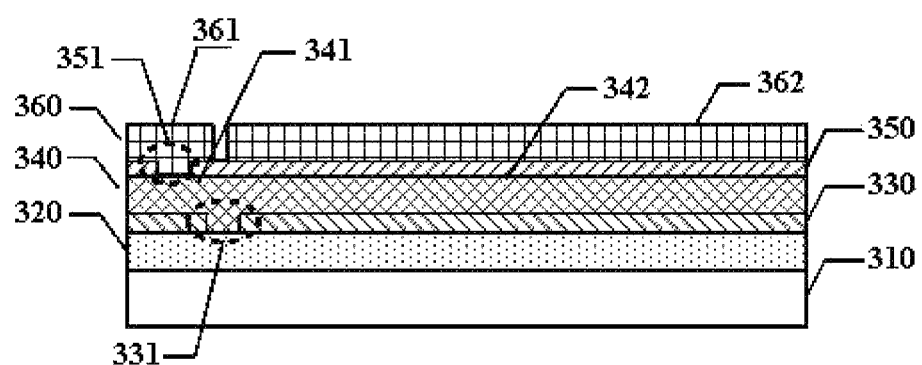
FIG. 3b illustrates an A-A sectional view of an exemplary array substrate in FIG. 3a consistent with disclosed embodiments.

According to the present disclosure, an improved array substrate and fabrication process are provided. FIG. 3a illustrates a top view of an exemplary array substrate consistent with disclosed embodiments. FIG. 3b illustrates an A-A sectional view of an exemplary array substrate in FIG. 3a consistent with disclosed embodiments. The exemplary array substrate consistent with disclosed embodiments will be illustrated in the accompanying FIG. 3a and FIG. 3b. Whenever possible, the same reference numbers will be used throughout FIG. 3a and FIG. 3b to refer to the same or like parts.

As shown in FIG. 3a and FIG. 3b, the array substrate may include a base substrate 310, a first conductive layer 320, a first passivation layer 330, a light-shielding layer including a plurality of first metal wires 340, a second passivation layer 350, and a first metal layer including a plurality of second metal wires 360. In particular, the first conductive layer 320 may be formed on the base substrate 310, the first passivation layer 330 may be formed on the first conductive layer 320, the light-shielding layer including the plurality of first metal wires 340 may be formed on the first passivation layer 330, the second passivation layer 350 may be formed on the light-shielding layer, and the first metal layer including the plurality of second metal wires 360 may be formed on the second passivation layer 350.

The plurality of first metal wires 340 included in the light-shielding layer may be arranged in parallel. The plurality of second metal wires 360 included in the first metal layer may also be arranged in parallel, which may be one-to-one corresponding to the plurality of first metal wires 340. The first passivation layer 330 may include a plurality of first through-holes 331 penetrating the first passivation layer 330, and each first metal wire 340 may be electrically connected to the first conductive layer 320 through at least one first through-hole 331. The second passivation layer 350 may include a plurality of second through-holes 351 penetrating the second passivation layer 350, and each second metal wire 360 may be electrically connected to the corresponding first metal wire 340 through at least one second through-hole 351.

Further, the array substrate may include a display area 30 and a non-display area. The plurality of first through-holes 331 and plurality of second through-holes 351 may be disposed in the non-display area. As shown in FIG. 3a, a dashed box indicated by the reference number 30 may be the display area of the array substrate, while the region beyond the dashed box may be the non-display area of the array substrate.

In the disclosed array substrate, through forming the plurality of first through-holes 331 in the first passivation layer 330, the first metal wires 340 may be electrically connected to the first conductive layer 320 through the first through-holes 331. Thus, the electrostatic charges accumulated at each first metal wire 340 during the manufacturing process of the array substrate may be transferred to the first conductive layer 320. Consequently, the electrostatic discharge at the tips of the first metal wires 340 caused by the electrostatic charges accumulated at the first metal wires 340, which may further damage the first metal wires 340 and/or the first passivation layer 330, may be prevented.

Similarly, through forming the plurality of second through-holes 351 in the second passivation layer 350, the second metal wires 360 may be electrically connected to the corresponding first metal wires 340 through the second through-holes 351. Thus, the electrostatic charges accumulated at each second metal wire 360 during the manufacturing process of the array substrate may be transferred to the corresponding first metal wire 340. Because the first metal wires 340 are electrically connected to the first conductive layer 320 through the first through-holes 331, the electrostatic charges accumulated at the second metal wires 360 during the manufacturing process of the array substrate may be further transferred to the first conductive layer 320 through the first through-holes 331.

That is, the electrostatic charges accumulated at the second metal wires 360 during the manufacturing process of the array substrate may be eventually transferred to the first conductive layer 320 through the second through-holes 351 and the first through-holes 331. Consequently, the electrostatic discharge at the tips of the second metal wires 360 caused by the electrostatic charges accumulated at the second metal wires 360, which may further damage the second metal wires 360 and/or the second passivation layer 350, may also be prevented.

It should be noted that, FIGS. 3a and 3b schematically illustrate that each first metal wire 340 is electrically connected to the first conductive layer 320 via one first through-hole 331, and each second metal wire 360 is electrically connected to the corresponding first metal wire 340 at the light-shielding layer via one second through-hole 351. However, the number of the first through-holes 331 and the number of the second through-holes 351 shown in FIGS. 3a and 3b are only for illustrative purposes, which are not intended to limit the scope of the present disclosure. Each first metal wire 340 may be electrically connected to the first conductive layer 320 via any number of first through-holes 331, and each second metal wire 360 may be electrically connected to the corresponding first metal wire 340 at the light-shielding layer via any number of second through-holes 351

In practical applications, according to requirements of specific application scenarios, the number of the first through-holes 331 formed between each first metal wire 340 and the first conductive layer 320, as well as the number of the second through-holes 351 formed between each second metal wire 360 and the corresponding first metal wire 340 may be adjusted to meet specific requirements of the application scenarios, as long as the first through-holes 331 and the second through-holes 351 are formed in the non-display region of the array substrate.

In one embodiment, as shown in FIG. 3a and FIG. 3b, along the direction perpendicular to the array substrate, for the first through-hole 331 and the second through-hole 351 connected to a same first metal wire 340, the projections of the first through-hole 331 on the light-shielding layer and the projection of the second through-hole 351 on the light-shielding layer may not be overlapped. That is, along the direction perpendicular to the array substrate, the projection of the first through-hole 331 on the light-shielding layer and the projection of the second through-hole 351 connected to a same first metal wire 340 on the light-shielding layer may not be overlapped.

In another embodiment, along the direction perpendicular to the array substrate, for the at least one first through-hole 331 and the least one second through-hole 351 connected to a same first metal wire 340, the projection of the first through-hole 331 on the light-shielding layer and the projection of the second through-hole 351 on the light-shielding layer may be at least partially overlapped. That is, along the direction perpendicular to the array substrate, the projection of the at least one first through-hole 331 on the light-shielding layer and the projection of the at least one second through-hole 351 connected to a same first metal wire 340 on the light-shielding layer may be at least partially overlapped. For example, along the direction perpendicular to the array substrate, the projection of the at least one first through-hole 331 on the light-shielding layer and the projection of the at least one second through-hole 351 connected to a same first metal wire 340 on the light-shielding layer may be fully overlapped.

Further, each second metal wire 360 may include at least one first segment 361 electrically connected to the second through-hole 351 and at least one second segment 362 electrically isolated from the second through-hole 351. In particular, each first segment 361 may be disposed at the non-display region, and at least a portion of each second segment 362 may be disposed at the display region 30.

The first metal wires 340 and the second metal wires 360 may be formed during an earlier stage of the manufacturing process of the array substrate, in which any segment of the second metal wires 360 may be electrically connected to the corresponding second through-hole 351. Thus, the electrostatic charges accumulated at the first metal wires 340 may be transferred to the first conductive layer 32, and the electrostatic charges accumulated at the second metal wires 360 may be transferred to the corresponding first metal wires 340 and then transferred to the first conductive layer 320.

Then during a later stage (e.g., after forming the TFTs) of the manufacturing process of the array substrate, each second metal wire 360 may be divided into at least one first segment 361 electrically connected to the second through-hole 351 and at least one second segment 362 electrically isolated from the second through-hole 351, for example, through laser cutting. Thus, the electrical connection between the first metal layer 360 and the first conductive layer 320 may be terminated. The second metal wires 360 may also be gate electrode lines or scanning lines electrically connected to the gate electrodes of the TFTs, providing scanning signals to the TFTs. After the manufacturing process of the array substrate is completed, when an electrical signal is applied to the second segment 362 of each second metal wire 360, a display panel comprising the array substrate may be able to display images properly.

During the laser cutting of the second metal wires 360, the laser may be configured to have a large power, such that the first segments 361 of each second metal wire 360 may be electrically isolated from the second segments 362 in the corresponding second metal wire 360. For example, during the laser cutting of the second metal wires 360, each first metal wire 340 may be also cut into a third segment 341 electrically connected to the first through-hole 331 and a fourth segment 342 electrically isolated from the first through-hole 331. Through testing the electrical insulation between the third segment 341 and the fourth segment 342 of the first metal wire 340, whether the first segments 361 and the second segments 362 of the second metal wire 360 are well electrically isolated or not may be determined indirectly.

Further, when along the direction perpendicular to the array substrate, the projection of the first through-hole 331 on the light-shielding layer and the projection of the second through-hole 351 connected to a same first metal wire 340 on the light-shielding layer are not overlapped, the laser cutting may be only configured to terminate the electrical connection between the light-shielding layer and the first conductive layer 320, for example, through cutting each first metal wire 340 into the third segment 341 electrically connected to the first through-hole 331 and the fourth segment 342 electrically isolated from the first through-hole 331. However, the electrical connection between the light-shielding layer and the first metal conductive layer 360 may be still remained, which may not affect the display function of the display panel.

When along the direction perpendicular to the array substrate, the projection of the at least one first through-hole 331 on the light-shielding layer and the projection of the at least one second through-hole 351 connected to a same first metal wire 340 on the light-shielding layer are partially or fully overlapped, the laser cutting may be configured to terminate the electrical connection between the light-shielding layer and the first conductive layer 320, as well as the electrical connection between the light-shielding layer and the first metal layer 360, otherwise the display function of the display panel may be affected.

In one embodiment, each second metal wire 360 may be electrically connected to one second through-hole 351, in which each second metal wire 360 may include one first segment 361 and one second segment 362.

In another embodiment, each second metal wire 360 may be electrically connected to two second through-holes 351, for example, which may be disposed at two ends of the second metal wire 360 respectively. Accordingly, each second metal wire 360 may include two first segments 361 and two second segments 362.

The first conductive layer 320 may be a transparent conductive layer, for example, an Indium Tin Oxide (ITO) film electroplated on a glass substrate. Typical light transmittance of the ITO film at the visible wavelength range is about 90%.

The first conductive layer 320 may be entirely deposited on the base substrate 110, or the first conductive layer 320 may be configured to have various shapes according to the requirements of practical applications (e.g. through a patterning process), all of which are within the scope of the present disclosure as long as the first metal wires 340 are electrically connected to the first conductive layer 320 through the first through-holes 331.

Figure 4A:
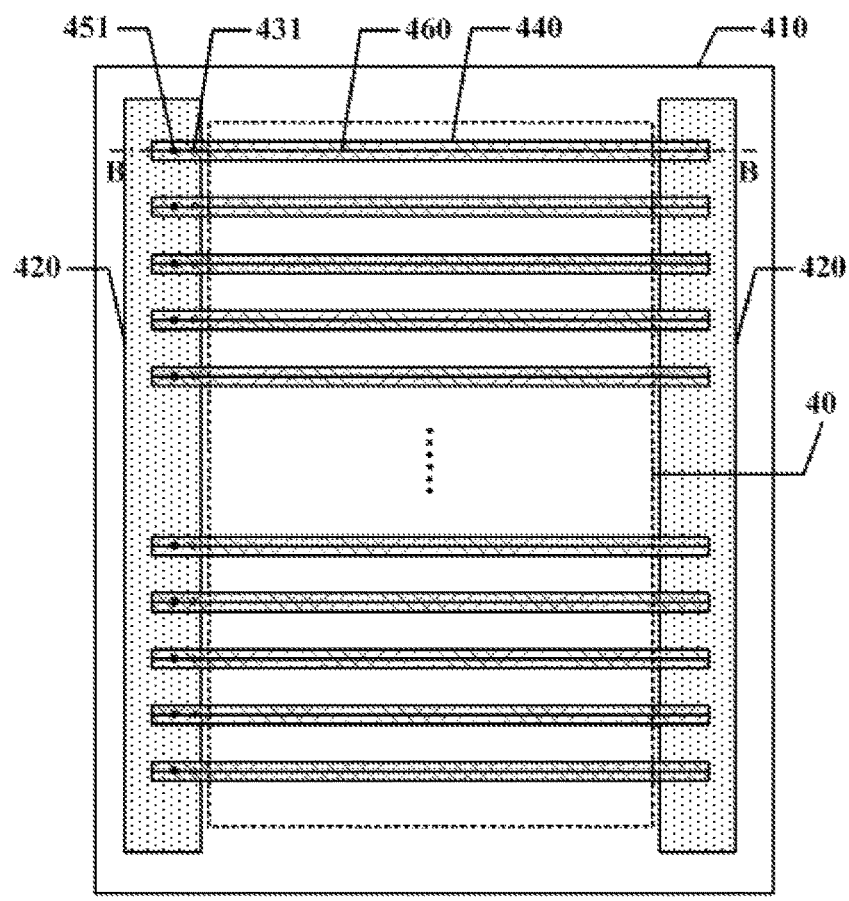
FIG. 4a illustrates a top view of another exemplary array substrate consistent with disclosed embodiments.
Figure 4B:
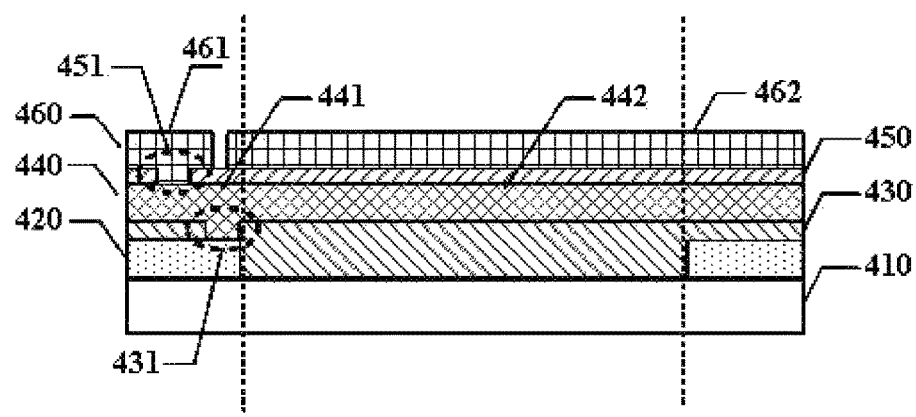
FIG. 4b illustrates a B-B sectional view of another exemplary array substrate in FIG. 4a consistent with disclosed embodiments.

FIG. 4a illustrates a top view of another exemplary array substrate consistent with disclosed embodiments. FIG. 4b illustrates a B-B sectional view of another exemplary array substrate in FIG. 4a consistent with disclosed embodiments.

Similar to the array substrate shown in FIGS. 3a-3b, the array substrate shown in FIGS. 4a-4b may also include a base substrate 410, a first conductive layer 420, a first passivation layer 430, a light-shielding layer including a plurality of first metal wires 440, a second passivation layer 450, and a first metal layer including a plurality of second metal wires 460. In particular, the first conductive layer 420 may be formed on the base substrate 410, the first passivation layer 430 may be formed on the first conductive layer 420, the light-shielding layer may be formed on the first passivation layer 430, the second passivation layer 450 may be formed on the light-shielding layer, and the first metal layer may be formed on the second passivation layer 450.

The plurality of first metal wires 440 may be arranged in parallel. The plurality of second metal wires 460 may also be arranged in parallel, which may be one-to-one corresponding to the plurality of first metal wires 440. The first passivation layer 430 may include a plurality of first through-holes 431 penetrating the first passivation layer 430, and each first metal wire 440 may be electrically connected to the first conductive layer 420 through at least one first through-hole 431. The second passivation layer 450 may include a plurality of second through-holes 451 penetrating the second passivation layer 450, and each second metal wire 460 may be electrically connected to the corresponding first metal wire 440 through at least one second through-hole 451.

Further, the array substrate may include a display area 40 and a non-display area. For example, the display area 40 may be located at center regions of the array substrate, and the non-display area may be located at edges of the array substrate. The plurality of first through-holes 431 and plurality of second through-holes 451 may be disposed in the non-display area. As shown in FIG. 4a, a dashed box indicated by the reference number 40 may be the display area of the array substrate, while the region beyond the dashed box may be the non-display area of the array substrate.

Each second metal wire 460 may include at least one first segment 461 electrically connected to the second through-hole 451 and at least one second segment 462 electrically isolated from the second through-hole 451. In particular, each first segment 461 may be disposed at the non-display region, and at least a portion of each second segment 462 may be disposed at the display region 40. Then during a later stage (e.g., after forming the TFTs) of the manufacturing process of the array substrate the electrical connection between the first metal layer 460 and the first conductive layer 420 may be terminated through, for example, the laser cutting. After the manufacturing process of the array substrate is completed, when an electrical signal is applied to the second segment 462 of each second metal wire 460, a display panel comprising the array substrate may be able to display images properly During the laser cutting of the second metal wires 460, the laser may be configured to have a large power, such that the first segments 461 of each second metal wire 460 may be electrically isolated from the second segments 462 in the corresponding second metal wire 460. For example, during the laser cutting of the second metal wires 460, each first metal wire 440 may be also cut into a third segment 441 electrically connected to the first through-hole 431 and a fourth segment 442 electrically isolated from the first through-hole 431. Through testing the electrical insulation between the third segment 441 and the fourth segment 442 of the first metal wire 440, whether the first segments 461 and the second segments 462 of the second metal wire 460 are well electrically isolated or not may be determined indirectly.

Different from the array substrate shown in FIGS. 3a-3b, the first conductive layer 420 in the array substrate shown in FIGS. 4a-4b may be disposed only at the non-display region of the array substrate.

When the first conductive layer 420 is deposited at the display region of the array substrate, light transmittance of the display region of the array substrate may be affected or attenuated by the first conductive layer 420, and the image performance may be degraded accordingly. Because the first conductive layer 420 may be a transparent conductive layer, for example, an Indium Tin Oxide (ITO) film electroplated on a glass substrate, and typical light transmittance of the ITO film at the visible wavelength range is about 90%. As a comparison, when the first conductive layer 420 is deposited at the non-display region of the array substrate, the light transmittance of the display region of the array substrate may not be attenuated by the first conductive layer 420 and the corresponding image performance degradation may be prevented.

Further, because the first through-holes 431 are disposed at the non-display region of the array substrate, depositing the first conductive layer 420 only at the non-display region of the array substrate may not affect the electrical connection between each first metal wire 440 and the first conductive layer 420 through the first through-hole 431. Thus, the first through-holes 431 may still be able to transfer the electrostatic charges accumulated at the first metal wires 440 and the second metal wires 460 to the first conductive layer 420. The "antenna effect" may be prevented accordingly.

Referring to FIG. 3a-3b and FIG. 4a-4b, along the direction perpendicular to the array substrate, the projection of each second metal wire 360 (460) on the light-shielding layer may be at least partially overlapped with the corresponding first metal wire 340 (440).

The light-shielding layer may be fabricated by metals having dark colors, such as molybdenum. For example, referring to FIG. 3a-3b and FIG. 4a-4b, molybdenum may be first deposited on the entire surface of the first passivation layer 330 (430), then etched to form the plurality of first metal wires 340 (440) parallel arranged. Because of the dark color of the first metal wires 340 (440), the first metal wires 340 (440) may be able to block light coming from a behind light source/board (e.g., light emitted by the backlight source/board of a display panel).

In addition, the first metal wires 340 (440) may also be able to cover the channels of the TFTs formed in the subsequent fabrication process of the array substrate, such that the TFTs may be prevented from the backlight irradiation and the image performance may be less affected. Because the current TFTs are often metal-oxide TFTs, the backlight irradiation may cause a shift in the threshold voltage ($V_{th}$) of the metal-oxide TFT, i.e., voltage necessary to turn on the metal-oxide TFT, and accordingly affect the stability of the metal-oxide TFT.

To further shield the backlight, when fabricating the second metal wires 360 (460) on the array substrate, along the direction perpendicular to the array substrate, the projection of each second metal wire 360 (460) on the light-shielding layer may be configured to be at least partially overlapped with the corresponding first metal wire 340 (440). In certain embodiments, along the direction perpendicular to the array substrate, the projection of each second metal wire 360 (460) on the light-shielding layer may be configured to be included in the corresponding first metal wire 340 (440).

Figure 6A:
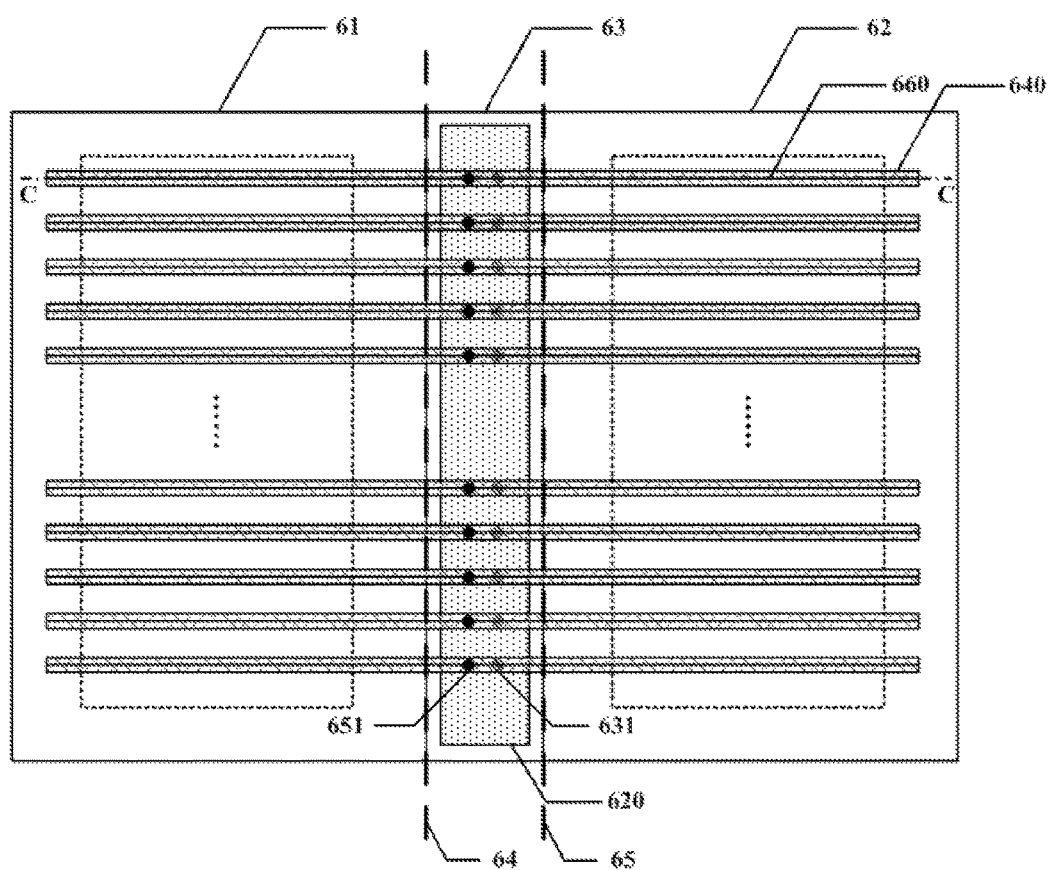
FIG. 6a illustrates a top view of another exemplary array substrate fabricated by an exemplary array substrate fabrication process consistent with disclosed embodiments.
Figure 6B:
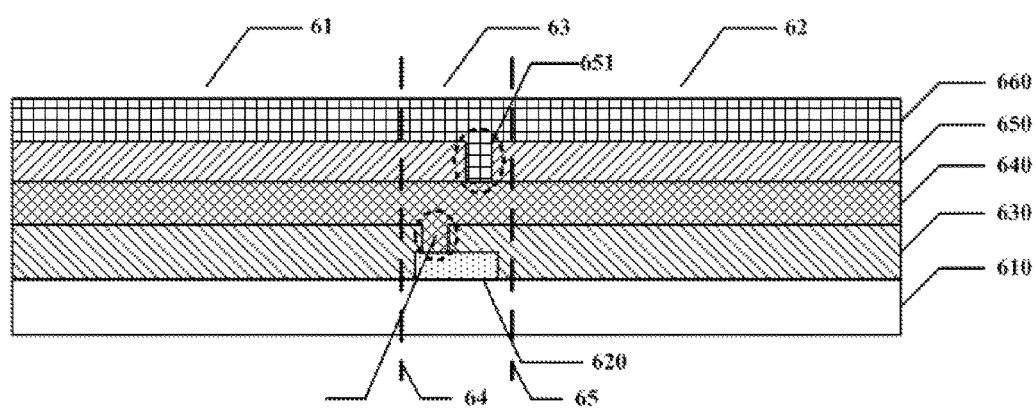
FIG. 6b illustrates a C-C sectional view of another exemplary array substrate in FIG. 6a consistent with disclosed embodiments.

FIG. 6a illustrates a top view of another exemplary array substrate fabricated by an exemplary array substrate fabrication process consistent with disclosed embodiments. FIG. 6b illustrates a C-C sectional view of another exemplary array substrate in FIG. 6a consistent with disclosed embodiments. The similarity between FIGS. 6a-6b and FIGS. 3a-3b are not repeated here, while certain differences may be illustrated.

As shown in FIGS. 6a-6b, two array substrates 61 and 62 may be adjacent along an extension direction of second metal wires 640, and a gap 63 may be formed between the two adjacent array substrates 61 and 62. For example, the two array substrates 61 and 62 may be two child array substrates in a parent array substrate.

A first conductive layer 620 may be only deposited in the gap 63 between the two adjacent array substrates 61 and 62. For example, the gap 63 between the two adjacent array substrates 61 and 62 may be a non-display region of the array substrate. Thus, a decrease in the light transmittance of the display region of the array substrates 61 and 62 caused by the first conductive layer 620 may be prevented, and a corresponding image performance degradation may also be prevented.

Further, a plurality of first through-holes 631 and a plurality of second through-holes 651 may be formed in the gap 63 between the two adjacent array substrates 61 and 62 accordingly.

In one embodiment, as shown in FIG. 6a, a plurality of first metal wires 640 may be simultaneously formed in the two adjacent array substrates 61 and 62 and, meanwhile, a plurality of second metal wires 660 may also be simultaneously formed in the two adjacent array substrates 61 and 62. That is, each first metal wire 640 may run through the gap 63 between the two adjacent array substrates 61 and 62, and each second metal wire 660 may also run through the gap 63 between the two adjacent array substrates 61 and 62.

Further, each first metal wire 640 in the array substrate 61 may be electrically connected to the first metal wire 640 disposed at a same position in the adjacent array substrate 62, and the two electrically connected first metal wires may be further electrically connected to the first conductive layer 620 through sharing at least one first through-hole 631. Similarly, each second metal wire 660 in the array substrate 61 may be electrically connected to the second metal wire 660 disposed at a same position in the adjacent array substrate 62, and the two electrically connected second metal wires may be further electrically connected to the first conductive layer 620 through sharing at least one second through-hole 651.

In another embodiment, any of the first metal wires 640 in the array substrate 61 and any of the first metal wire 640 in the adjacent array substrate 62 may not be electrically connected within the light-shielding layer including the plurality of first metal wires 640. Meanwhile, any of the second metal wire 660 in the array substrate 61 and any of the second metal wire 660 in the adjacent array substrate 62 may not be electrically connected within the first metal layer including the plurality of second metal wires 660.

Consequently, a plurality of first through-holes 631 corresponding to the plurality of first metal wires 640 in the array substrate 61, a plurality of second through-holes 651 corresponding to the plurality of second metal wires 660 in the array substrate 61, a plurality of first through-holes 631 corresponding to the plurality of first metal wires 640 in the adjacent array substrate 62, and a plurality of second through-holes 651 corresponding to the plurality of second metal wires 660 in the adjacent array substrate 62 may be formed in the gap 63 between the array substrate 61 and the adjacent array substrate 62, respectively.

After the plurality of second metal wires 660 are fabricated, the array substrate (i.e., the parent array substrate) may be cut respectively along a line 64 and a line 65 shown in FIGS. 6a-6b. Thus, the electrical connection between each first metal wire 640 and the corresponding second metal wire 660 may be terminated, and each first metal wire 640 in the fabricated array substrate may be able to receive electrical signals properly. That is, after the electrostatic charges accumulated at the second metal wires 660 and the first metal wires 640 during the manufacturing process of the array substrate are transferred to the first conductive layer 620 and dissipated, the electrical connection between each first metal wire 640 and the corresponding second metal wire 660 may be terminated through cutting along the line 64 and the line 65 respectively.

Thus, on one hand, the electrostatic charges accumulated at the first metal wires 640 and at the second metal wires 660 during the manufacturing process of the array substrates may be dissipated, and the corresponding electrostatic discharges at the tips of the first metal wires 640 and at the tips of the second metal wires 660 may be prevented. On the other hand, after terminating the electrical connection between each first metal wire 640 and the corresponding second metal wire 660 through cutting along the line 64 and the line 65, each first metal wire 640 in the fabricated array substrates 61 and 62 may be able to receive electrical signals properly. The display panel comprising the array substrate 61 (or 62) may be able to display images properly.

In certain embodiments, the first conductive layer 620 may be a transparent conductive layer, for example, an ITO film electroplated on a glass substrate. Along the direction perpendicular to the array substrate, the projection of each second metal wire 660 on the light-shielding layer may be at least partially overlapped with the corresponding first metal wire 640.

In the disclosed array substrates, the electrostatic charges accumulated at the first metal wires and the second metal wires during the manufacturing process of the array substrate may be eventually transferred to the first conductive layer and then dissipated. Consequently, the electrostatic discharge between adjacent first metal wires and adjacent second metal wires, which may further damage the metal wires and/or the passivation layers, may be prevented. Thus, before forming the antistatic devices in the display panel, the electrostatic charges accumulated at the metal wires (i.e., the first metal wires and the second metal wires) during the manufacturing process of the array substrate may be transferred to the first conductive layer and then dissipated, and the damage to wires caused by the accumulation of the electrostatic electricity in the manufacturing process of the array substrate may be prevented accordingly. The manufacturing yield and reliability of the array substrates, especially the array substrates with a high PPI, may be significantly enhanced. Further, the design of the array substrates with a high PPI may be simplified and the process margin may be improved.

Figure 7:
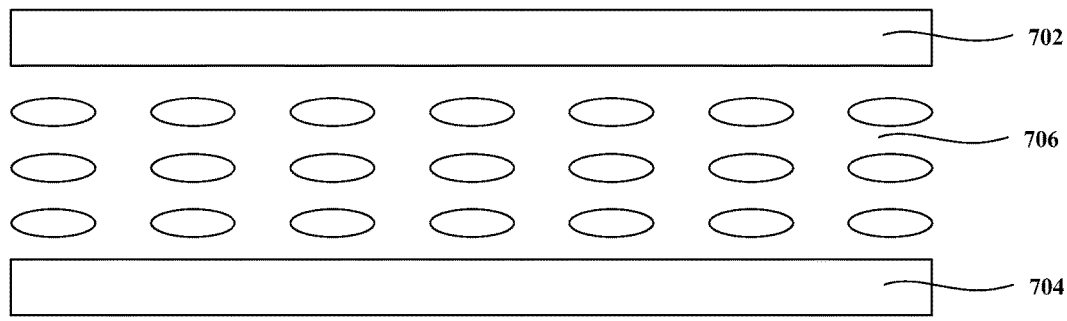
FIG. 7 illustrates a cross-sectional view of an exemplary display panel consistent with disclosed embodiments.

The present disclosure further provides a display panel. FIG. 7 illustrates a cross-sectional view of an exemplary display panel consistent with disclosed embodiments. The display panel 700 may be a display panel utilizing a display medium, e.g. liquid crystal (LC) display panel, quantum dots (QD) display panel, or a display panel utilizing self-lighting elements, e.g. organic light-emitting diode (OLED) display panel, light-emitting diode (LED) display panel. For example, as shown in FIG. 7, the display panel 700 may include an array substrate 702, a color film substrate 704 arranged opposite to the array substrate 702, and a liquid crystal layer 706 sandwiched between the array substrate 702 and the color film substrate 704. The array substrate 702 may be any one of the disclosed array substrates. Although the liquid crystal display panel is shown in FIG. 7, the display panel 700 may be any appropriate type of display panel including any one of the disclosed array substrates.

The display panel 700 may be a smartphone, a tablet, a TV, a monitor, a notebook, a digital picture frame, a GPS, etc. Further, the display panel 700 may be any product or any component which is capable of displaying images and/or videos.

Figure 5:
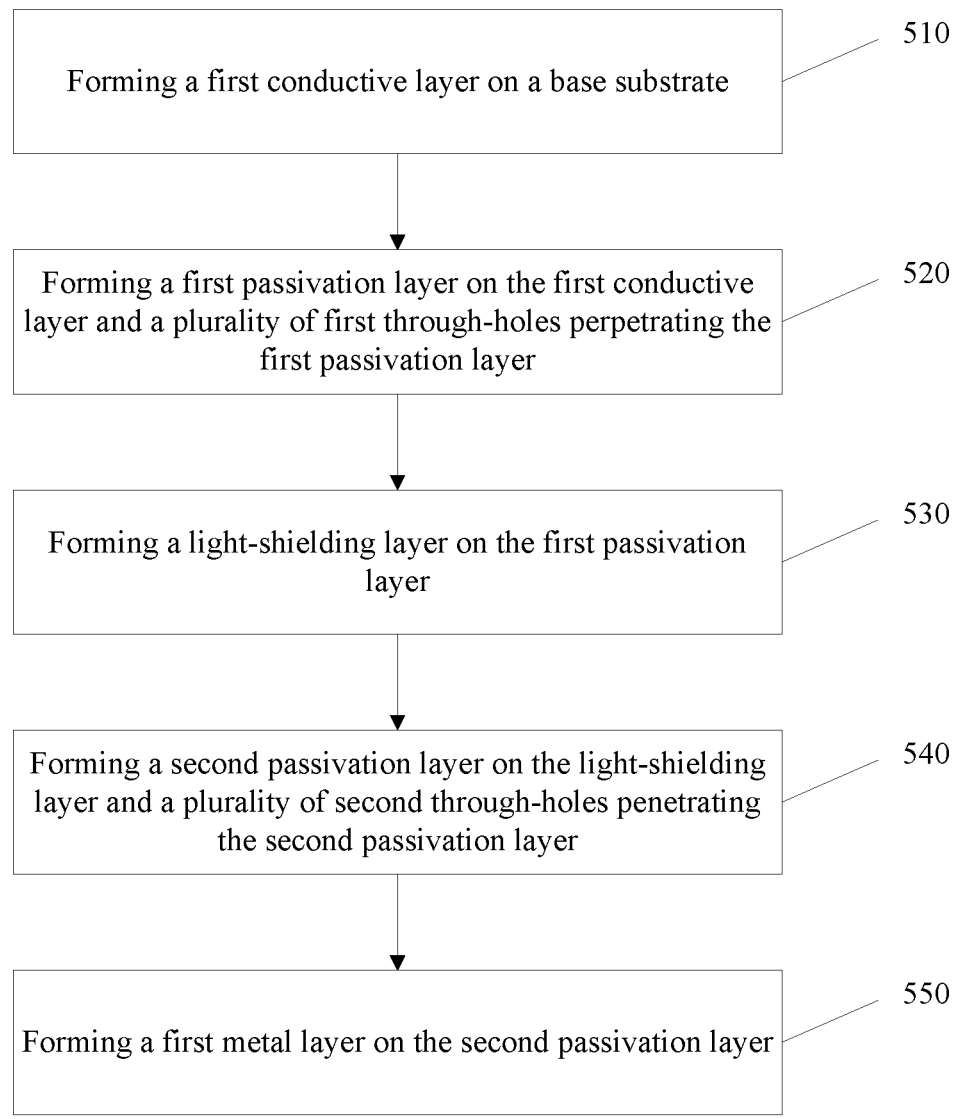
FIG. 5 illustrates a flow chart of an exemplary array substrate fabrication process consistent with disclosed embodiments.

FIG. 5 illustrates a flow chart of an exemplary array substrate fabrication process consistent with disclosed embodiments. As shown in FIG. 5, the array substrate fabrication process may include the following steps.

Step S510: forming a first conductive layer on a base substrate.

Step S520: forming a first passivation layer on the first conductive layer and disposing a plurality of first through-holes perpetrating the first passivation layer. For example, the first through-holes perpetrating the first passivation layer may be formed by a patterning process.

Step S530: forming a light-shielding layer on the first passivation layer. The light-shielding layer may include a plurality of first metal wires arranged in parallel, and each first metal wire may be electrically connected to the first conductive layer through at least one first through-hole.

Step S540: forming a second passivation layer on the light-shielding layer and disposing a plurality of second through-holes penetrating the second passivation layer. For example, the second through-holes perpetrating the second passivation layer may be formed by the patterning process.

Step S550: forming a first metal layer on the second passivation layer. The first metal layer may include a plurality of second metal wires arranged in parallel and one-to-one corresponding to the plurality of first metal wires. Each second metal wire may be electrically connected to the corresponding first metal wire through at least one second through-hole.

The disclosed array substrate fabrication process may be adopted to fabricate one array substrate, or simultaneously fabricate a plurality of array substrates arranged in an array, in which multiple array substrates may be obtained through cutting the plurality of array substrates arranged in the array. For example, a plurality of child array substrates may be obtained through cutting a parent array substrate fabricated by the disclosed array substrate fabrication process.

In one embodiment, along the direction perpendicular to the array substrate, the projection of the first through-hole on the light-shielding layer and the projection of the second through-hole connected to a same first metal wire on the light-shielding layer may be at least partially overlapped.

In another embodiment, along the direction perpendicular to the array substrate, the projection of the first through-hole on the light-shielding layer and the projection of the second through-hole connected to a same first metal wire on the light-shielding layer may not be overlapped.

In certain embodiments, the array substrate may include a display region and a non-display region, and the first through-holes and the second through-holes may be disposed at the non-display region. Then the corresponding array substrate fabrication process may further include dividing each second metal wire into at least one first segment electrically connected to the second through-hole and at least one second segment electrically isolated from the second through-hole. In particular, each first segment may be disposed at the non-display region, and the fabricated array substrate may have a structure shown in FIGS. 3a-3b, which is not repeated here. For example, each second metal wire may be divided into at least one first segment electrically connected to the second through-hole and at least one second segment electrically isolated from the second through-hole through laser cutting.

In certain other embodiments, when the first through-holes and the second through-holes are formed at the non-display region of the array substrate, the first conductive layer may be configured to be only formed in the non-display region of the array substrate in the Step S510. The fabricated array substrate may have a structure shown in FIGS. 4a-4b, which is not repeated here. When the first conductive layer is deposited at the display region of the array substrate, the light transmittance of the display region of the array substrate may be affected or attenuated by the first conductive layer and the image performance may be degraded accordingly. As a comparison, when the first conductive layer is deposited at the non-display region of the array substrate, the light transmittance of the display region of the array substrate may not be attenuated by the first conductive layer and the image performance may not be degraded.

In certain other embodiments, the first through-holes and the second through-holes may be formed between two array substrates (e.g., two child array substrates), which may be adjacent along the extension direction of the second metal wires. The array substrate fabrication process may further include cutting the array substrate (e.g., parent array substrate), such that the first through-holes and the second through-holes may be electrically isolated from the array substrate.

When the first through-holes and the second through-holes are formed between two array substrates adjacent along the extension direction of the second metal wires, the first conductive layer may be only formed in the gap between two array substrates adjacent along an extension direction of the second metal wires in the Step 510. The fabricated array substrate may have a structure shown in FIGS. 6a-6b, which is not repeated here.

In the disclosed array substrate fabrication process, through forming the plurality of first through-holes in the first passivation layer, the first metal wires may be electrically connected to the first conductive layer through the first through-holes. Thus, the electrostatic charges accumulated at each first metal wire during the manufacturing process of the array substrate may be transferred to the first conductive layer. Consequently, the electrostatic discharge between adjacent first metal wires caused by the electrostatic charge accumulation at the first metal wires, which may further damage the first metal wires and/or the first passivation layer, may be prevented.

Similarly, through forming the plurality of second through-holes in the second passivation layer, the second metal wires may be electrically connected to the corresponding first metal wires through the second through-holes. Thus, the electrostatic charges accumulated at each second metal wire during the manufacturing process of the array substrate may be transferred to the corresponding first metal wire. Because the first metal wires may be electrically connected to the first conductive layer through the first through-holes, the electrostatic charges accumulated at each second metal wire during the manufacturing process of the array substrate may be further transferred to the first conductive layer through the first through-holes and then dissipated.

That is, the electrostatic charges accumulated at the second metal wires during the manufacturing process of the array substrate may be eventually transferred to the first conductive layer through the second through-holes and the first through-holes, and then dissipated. Consequently, electrostatic discharge between adjacent second metal wires caused by the electrostatic charge accumulation at the second metal wires, which may further damage the second metal wires and/or the second passivation layer, may be prevented.

Thus, before forming the antistatic devices in the display panel, the electrostatic charges accumulated at the metal wires (i.e., the first metal wires and the second metal wires) during the manufacturing process of the array substrate may be transferred to the first conductive layer and then dissipated, and the damage to wires caused by the accumulation of the electrostatic electricity in the manufacturing process of the array substrate may be prevented accordingly. The manufacturing yield and reliability of the array substrates, especially the array substrates with a high PPI, may be significantly enhanced. Further, the design of the array substrates with a high PPI may be simplified and the process margin may be improved.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An array substrate, comprising:
a base substrate;
a first conductive layer formed on the base substrate, wherein the first conductive layer is a transparent conductive layer;
a first passivation layer formed on the first conductive layer and including a plurality of first through-holes;
a light-shielding layer formed on the first passivation layer and including a plurality of first metal wires arranged in parallel;
a second passivation layer formed on the light-shielding layer including a plurality of second through-holes; and
a first metal layer formed on the second passivation layer and including a plurality of second metal wires arranged in parallel and one-to-one corresponding to the plurality of first metal wires,
wherein a first metal wire is electrically connected to the first conductive layer through at least one first through-hole,
a second metal wire is electrically connected to the corresponding first metal wire through at least one second through-hole,
the array substrate includes a display region and a non-display region, and
the plurality of first through-holes and the plurality of second through-holes are formed at the non-display region of the array substrate.

2. The array substrate according to claim 1, wherein:
along a direction perpendicular to the array substrate, a projection of the at least one first through-hole on the light-shielding layer and a projection of the at least one second through-hole connected to a same first metal wire on the light-shielding layer are at least partially overlapped.

3. The array substrate according to claim 1, wherein:
along the direction perpendicular to the array substrate, a projection of the at least one first through-hole on the light-shielding layer and a projection of the at least one second through-hole connected to a same first metal wire on the light-shielding layer are not overlapped.

4. The array substrate according to claim 1, wherein:
the second metal wire includes at least one first segment electrically connected to the second through-hole and at least one second segment electrically isolated from the second through-hole; and
the at least one first segment of the second metal wire is disposed at the non-display region of the array substrate.

5. The array substrate according to claim 1, wherein:
the first conductive layer is disposed at the non-display region of the array substrate.

6. The array substrate according to claim 1, wherein:
along the direction perpendicular to the array substrate, the projection of the second metal wire on the light-shielding layer is at least partially overlapped with the corresponding first metal wire.

7. A display panel comprises the array substrate according to claim 1, further including:
a color film substrate arranged opposite to the array substrate; and
a liquid crystal layer sandwiched between the color film substrate and the array substrate.

8. An array substrate fabrication method, comprising:
forming a first conductive layer on a base substrate, wherein the first conductive layer is a transparent conductive layer;
forming a first passivation layer on the first conductive layer and a plurality of first through-holes perpetrating the first passivation layer;
forming a light-shielding layer on the first passivation layer, wherein the light-shielding layer includes a plurality of first metal wires arranged in parallel, and a first metal wire is electrically connected to the first conductive layer through at least one first through-hole;
forming a second passivation layer on the light-shielding layer and a plurality of second through-holes penetrating the second passivation layer; and
forming a first metal layer on the second passivation layer, wherein the first metal layer includes a plurality of second metal wires arranged in parallel and one-to-one corresponding to the plurality of first metal wires, and a second metal wire is electrically connected to the corresponding first metal wire through at least one second through-hole.

9. The array substrate fabrication method according to claim 8, wherein:
along a direction perpendicular to the array substrate, a projection of the at least one first through-hole on the light-shielding layer and a projection of the at least one second through-hole connected to a same first metal wire on the light-shielding layer are at least partially overlapped.

10. The array substrate fabrication method according to claim 8, wherein:
along the direction perpendicular to the array substrate, a projection of the at least one first through-hole on the light-shielding layer and a projection of the at least one second through-hole connected to a same first metal wire on the light-shielding layer are not overlapped.

11. The array substrate fabrication method according to claim 8, wherein:
the array substrate includes a display region and a non-display region; and
the first through-holes and the second through-holes are disposed at the non-display region of the array substrate.

12. The array substrate fabrication method according to claim 8, further including:
determining a plurality of child array substrates on the array substrate, wherein the child array substrates are arranged in an array.

13. The array substrate fabrication method according to claim 12, wherein:
the first through-holes and the second through-holes are respectively formed in the first passivation layer and the second passivation layer disposed in a gap between two child array substrates adjacent along an extension direction of the second metal wires.

14. The array substrate fabrication method according to claim 13, further including:
cutting the array substrate to electrically isolate the first through-holes and the second through-holes from the child array substrates.

15. The array substrate fabrication method according to claim 11, further including:
dividing the second metal wire into at least one first segment electrically connected to the second through-hole and at least one second segment electrically isolated from the second through-hole; and
the at least one first segment in the second metal wire is disposed at the non-display region of the array substrate.

16. The array substrate fabrication method according to claim 15, wherein dividing the second metal wire into at least one first segment electrically connected to the second through-hole and at least one second segment electrically isolated from the second through-hole further includes:
dividing the second metal wire into at least one first segment electrically connected to the second through-hole and at least one second segment electrically isolated from the second through-hole through laser cutting.

17. The array substrate fabrication method according to claim 8, wherein:
the first conductive layer is disposed at the non-display region of the array substrate.

18. The array substrate fabrication method according to claim 17, wherein:
along the direction perpendicular to the array substrate, the projection of the second metal wire on the light-shielding layer is at least partially overlapped with the corresponding first metal wire.

* * * * *